IMPEDANCE MATCHED BROAD BAND TRANSISTOR AMPLIFIER
Filed July 10, 1963 2 Sheets-Sheet 1
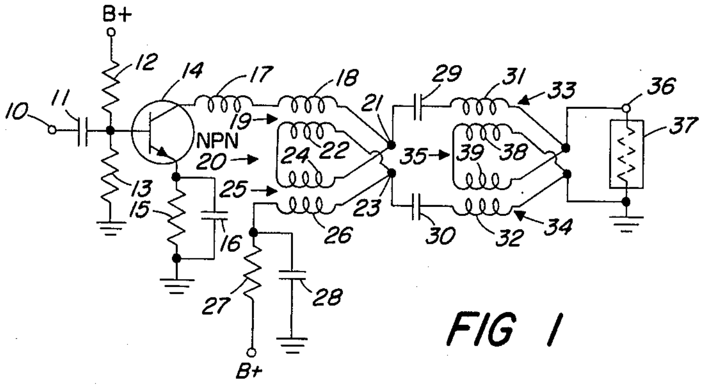
FIG 1
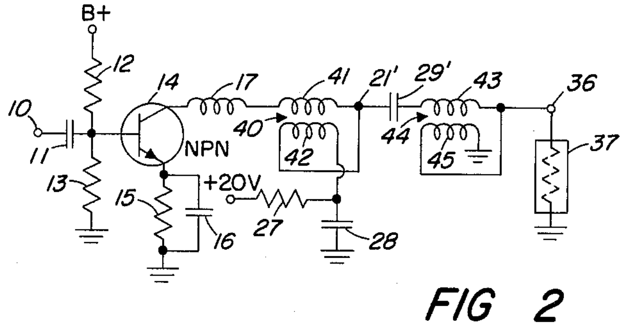
FIG 2
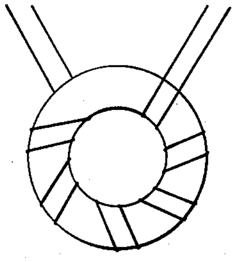
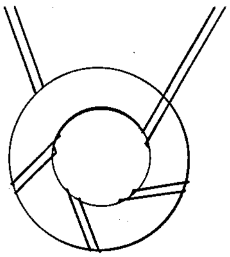
FIG 3 FIG 4
INVENTOR.
SAMUEL L. BROADHEAD JR.
BY
Moody and Kintzinger
ATTORNEYS

IMPEDANCE MATCHED BROAD BAND TRANSISTOR AMPLIFIER

Filed July 10, 1963 2 Sheets-Sheet 2

INVENTOR.
SAMUEL L. BROADHEAD JR.
BY
Moody and Kintzinger
ATTORNEYS

3,244,998
IMPEDANCE MATCHED BROAD BAND TRANSISTOR AMPLIFIER

Samuel L. Broadhead, Jr., Cedar Rapids, Iowa, assignor to Collins Radio Company, Cedar Rapids, Iowa, a corporation of Iowa Filed July 10, 1963, Ser. No. 294,028
10 Claims. (Cl. 330—31)

This invention relates in general to radio frequency amplifiers and more particularly to wide band RF amplifiers operable at substantially maximum efficiency and maximum gain over the entire band of operation.

Extensive research requiring the expenditures of great sums of money, time, and continuing effort has been conducted in the area of communications in trying to provide increasingly useful and efficient broad band amplifiers operable through increasingly extensive ranges extending through much of the HF and VHF frequency spectrum. With conventional techniques of cascading stages, difficulties are encountered that become increasingly severe with a trend to increasingly wider band width amplifiers. With tubes used in amplifiers, it has become apparent that a maximum gain width factor exists for any given tube. Further, many heterodyne and radio receivers and transmitters using more conventional wide band amplifiers, require tuning and tracking arrangements with their adjustment requirements and require associated mechanical moving parts for obtaining reasonable gain stability with frequency change. However, such tuning and tracking arrangements not only add additional equipment, bulk, shielding problems, expense and complexity, but also tuning and tracking problems of their own, particularly in operation over wide frequency ranges.

It is, therefore, a principal object of this invention to attain near optimum gain through an amplifier over a wide frequency range from well down in HF to well up in VHF without tuning over the operation frequency range, for example, through a range of from 20 mc. to 75 mc.

Another object is to provide such optimum gain factors in an amplifier of minimum size and complexity having optimum operational efficiency throughout the range of operation.

Features of this invention useful in accomplishing the above objects include an amplifier utilizing a plurality of transmission line sections with each section providing a four to one impedance transformation to give the overall impedance transformation required in amplifier coupling. The transmission line sections of some embodiments would be true straight transmission lines, and in some embodiments they would be looped transmission lines for short jumper lines between end terminals. In still further embodiments the transmission line sections take the form of double wire wound transformer coil sections in providing the desired transmission line four to one impedance transformation characteristics.

Specific embodiments representing what are presently regarded as the best mode of carrying with the invention are illustrated in the accompanying drawing.

In the drawing:

FIGURE 1 represents a schematic of a broad band amplifier utilizing double wound coils in transmission line sections in an amplifier according to the invention;

FIGURE 2, another amplifier embodiment utilizing only one double wound coil in each transmission line section of the amplifier;

FIGURES 3 and 4 are illustrated two-wire bifilar wound toroid type transformer sections that may be used as double wound coils in transmission line sections of the embodiments of FIGURES 1 and 2;

Figure 5:
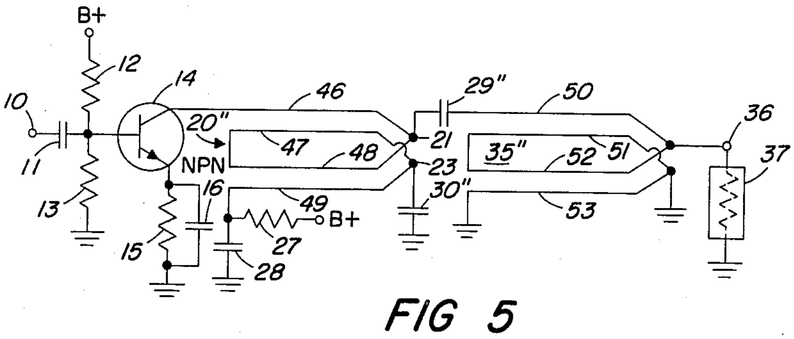
FIGURE 5 illustrates a straight line transmission line section amplifier embodiment.

Referring to the drawing:

The broad band amplifier of FIGURE 1 is shown to include a radio frequency signal receiving terminal 10 connected serially through capacitor 11 and the common junction of resistors 12 and 13, serially connected between a voltage supply and ground, to the base of NPN transistor 14. The emitter of transistor 14 is connected through resistor 15 and capacitor 16 in parallel to ground. The signal output collector of transistor 14 is connected through coil 17 to the input terminal of coil 18, of transformer 19, and a first transmission line section 20. The other end of coil 18 is connected to an output terminal 21 while a second coil 22 of transformer 19 is connected at one end to a second output terminal 23 and at the other end to a coil 24 of a second transformer 25 of the transmission line section 20. The other end of coil 24 is connected, in common with coil 18, to output terminal 21. A second coil 26 of transformer 25 is connected at one end to terminal 23, in common with coil 22, and at the other end through resistor 27 to the positive voltage supply and also through capacitor 28 to ground.

The output terminals 21 and 23, of transmission line section 20, are connected, respectively, through capacitors 29 and 30 and coils 31 and 32, of transformers 33 and 34, respectively, of transmission line section 35, to terminal 36 of load device 37 and ground. The second coils 38 and 39, of transformers 33 and 34 in transmission line section 35, are connected together at one end and at their other ends, respectively, coil 38 to ground in common with coil 32 and one end of load device 37, and coil 39 in common with coil 31 to terminal 36.

Components and values used in a broad band amplifier, according to FIGURE 1, where the load device 37 is adjusted to 50 ohms and may be the base of a transistor, and with the 50 ohm load transformed to 800 ohms at the input terminal of the first transmission line section 20, include the following:

| | | |
|---|---|---|
| Capacitor **11** | pf | 1000 |
| Resistor **12** | ohms | 10K |
| Resistor **13** | do | 2.2K |
| NPN transistor **14** | | 2N917 |
| Resistor **15** | ohms | 1K |
| Capacitor **16** | $\mu$f | .01 |
| Coil **17** | $\mu$h | 1.5 |
| Transformers **19** and **25** characteristic impedance | ohms | $Z_0=400$ |
| Capacitors **29** and **30** | pf | 1000 |
| Transformers **33** and **34** characteristic impedance | ohms | $Z_0=100$ |
| Voltage supply | volts | +18 |

With the above component values and with the transformers as transmission lines having sufficient inductiveness to operate as transformers at 20 mc., the broad band amplifier of FIGURE 1 was found to give near optimum gain without tuning over a frequency range of from 20 mc. to 75 mc. It gives a four to one impedance transformation in each of the transmission line sections 20 and 35, resulting in a 16 to 1 transformation of from 800 ohms at the input terminal of transmission line section 20 to the 50 ohm load. Further, the transistor 14 input capacitance of about 2 $\mu\mu$f. and output capacitance also about 2 $\mu\mu$f. are negligible in their effect on amplifier operation. The inductance of coil 17 optimizes the load at the higher end of the frequency range to effectively raise the collector load without appreciably changing power gain over the operational frequency range with a proper range of output loads. The amplifier would give a power gain versus frequency variation operation at substantially stable db throughout the frequency range of 20 to 70 mc., such as illustrated in the performance curve of FIGURE 7. It should be noted that impedance transformation by steps of four to one for each transmission line section may be up or down and need not be restricted to a 16 to 1 transformation downward to an output load as shown in the various embodiments, but may be by steps of $4^n$ power to 1 up or down as may be required in various amplifier applications and as limited by other practical considerations.

In the embodiment of FIGURE 2, components duplicating those in the embodiment of FIGURE 1 are, for the sake of convenience, numbered the same. In the FIGURE 2 embodiment, one transformer is used in each transmission line section instead of two transformers per section as in FIGURE 1 to give substantially the same performance characteristics.

The coil 17 of this embodiment is connected through the input terminal of transmission line section 40 and through coil 41 to output terminal 21' while the second coil 42 of the transmission line section 40, forming a single transformer with coil 41, is connected at the coil 42 end adjacent the input terminal to the transmission line section 40 to terminal 21', and at the other end through resistor 27 to the positive voltage supply and also through capacitor 28 to ground.

The output terminal 21' of transmission line section 40 is connected through capacitor 29' and coil 43 of transmission line section 44 to terminal 36 of load device 37. The second coil 45, effectively forming a single transformer with coil 43 in transmission line section 44, is connected at the end of coil 45 adjacent the capacitor 29' end of coil 43 to the terminal 36 end of coil 43, and the other end of coil 45 is connected to ground.

Figure 7:
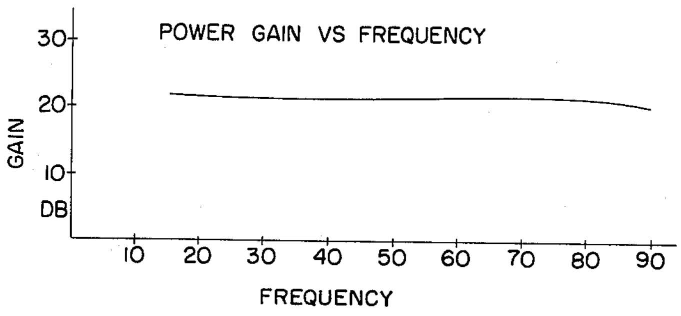
FIGURE 7, a performance curve illustrating gain db variation with frequency change through a transmission line section amplifier according to the invention.

The broad band RF amplifier of FIGURE 2, with a 75 ohm load transformed to 1200 ohms at the input terminal of the first transmission line section 40, was found to give stable power gain performance with negligible db variation through a frequency range of approximately 15 mc. to over 85 mc. as shown by the performance curve of FIGURE 7. This performance was provided with components and values used including the following:

| | |
|---|---|
| Capacitor **11** ____________ μf__ | .01 |
| Resistor **12** ____________ ohms__ | 10K |
| Resistor **13** ____________ do____ | 2.2K |
| NPN transistor **14** ____________ | 2N917 |
| Resistor **15** ____________ ohms__ | 1K |
| Capacitor **16** ____________ μf__ | .01 |
| Coil **17** ____________ μh__ | 1.5 |
| Transformer of transmission line section **40** characteristic impedance, ohms__ | $Z_0=600$ |
| Capacitor **29'** ____________ pf__ | 1000 |
| The transformer of transmission line section **44** characteristic impedance, ohms__ | $Z_0=150$ |
| Voltage supply ____________ volts__ | +18 |

Many different transformer configurations may be utilized for the transformers 19, 25, 32, and 34, of the FIGURE 1 embodiment, and the single transformers of each of the transmission line sections 40 and 44 in the FIGURE 2 embodiment, such as the two-wire bifilar toroid transformer shown in FIGURE 3, and alternately the type shown in FIGURE 4, and possibly both together in one broad band amplifier for different transmission line stages of the amplifier.

In the alternate embodiment of FIGURE 5, true straight transmission line sections are used in place of the transformer embodiment line sections of the FIGURE 1 embodiment. Here again components duplicating those in the embodiment of FIGURE 1 are, for the sake of convenience, numbered the same. The collector of NPN transistor 14 of this embodiment is connected directly through the input terminal of the transmission line section 20'' and through line 46 to output terminal 21.

An additional line 47, parallel to and paired with line 46 as a transmission line section subpair of lines, is connected at the output end to output terminal 23 and at the other end, the end adjacent the input terminal to line 46, line 47 is conneced to line 48 of a second pair of lines including line 49 of the transmission line section 20''. Line 48 is connected at its other end to output terminal 21. Line 49, on the other hand, is connected through resistor 27 to the positive voltage supply and also through capacitor 28 to ground at one end, and at the other end to terminal 23 in common with line 47 and through capacitor 30'' to ground.

The output terminal 21 of transmission line section 20'' acts as the input terminal through capacitor 29'' to transmission line section 35''. Capacitor 29'' is connected through line 50 to output terminal 36, and line 50 is paired with line 51 to form a transmission line subsection in the transmission line section 35''. A second pair of lines, 52 and 53, form an additional transmission line subsection in transmission line section 35'' with line 52 connected at one end in common with line 50 to terminal 36 and at its other end to line 51. Line 53, however, is connected at one end in common with line 51 to ground and also at its other end to ground. It should be noted that the interconnection between the output terminals 21 and 23 of the embodiment of FIGURE 5 could be interconnected to transmission line section 35'' in the same manner as the terminals 21 and 23 are connected to the transmission line section 35 of the embodiment of FIGURE 1 using capacitors 29 and 30. In like manner, the interconnecting arrangement between the two transmission line sections of the FIGURE 5 embodiment could be utilized to interconnect the transmission line sections 20 and 35 in the FIGURE 1 embodiment in place of the interconnecting arrangement as shown for that embodiment.

In the embodiment of FIGURE 5 with an output load of $R_L$ the characteristic impedance $Z_0$ through each subtransmission line of transmission line section 35'' would equal $2R_L$ with the impedance transformation back to terminal 21 appearing to be $4R_L$. The characteristic impedance through each subtransmission line of transmission line section 20'' would equal $8R_L$ and, with a four to one impedance transformation through the transmission line section 20'', the total impedance transformation back to the input terminal and the collector output of transistor 14 is $16R_L$.

Figure 6:
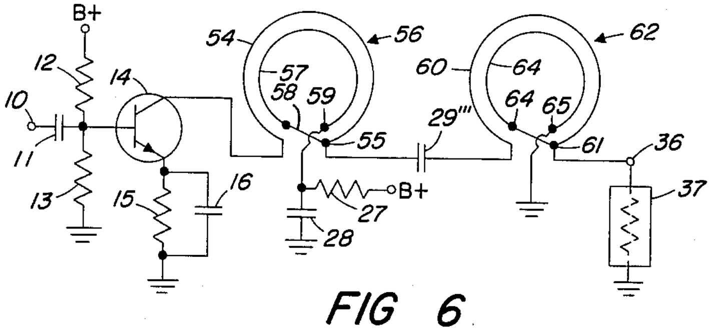
FIGURE 6 is a looped transmission line amplifier embodiment with short terminal jumpers.

Referring now to the alternate embodiment of FIGURE 6, looped transmission line sections are used in place of the transformers used as transmission line sections in the embodiment of FIGURE 2, and the coil 17 of the FIGURE 2 embodiment has been eliminated. Here again components duplicating those in the embodiments of FIGURE 2 and FIGURE 1 are, for the sake of convenience, numbered the same. With this embodiment the collector of NPN transistor 14 is connected directly to and through single looped line 54 to output terminal 55 of first looped transmission line section 56. Line 54 is paired with line 57 in looped parallel relationship therewith to form the transmission line section 56. Further, line 57 is connected at one end by a short jumper line 58 to output terminal 55, and is connected at its opposite closely adjacent end terminal 59 through resistor 27 to the positive voltage supply and also through capacitor 28 to ground.

The output terminal 55 of looped transmission line section 56 is connected through capacitor 29''' directly to and through single looped line 60 to output terminal 61 of second looped transmission line section 62. Line 60 is paired with line 63 in looped parallel relationship therewith to form the transmission line section 62. Further, line 63 is connected at one end by a short jumper line 64 to output terminal 61, and is connected at its opposite closely adjacent end terminal 65 directly to ground. Output terminal 61 is directly connected to terminal 36 and load device 37 and terminals 61 and 36 may in some embodiments be combined as one terminal. This looped transmission line section embodiment gives substantially the same operational performance provided by the other embodiments and has the same impedance factors and impedance transformation factors of 4 to 1 through each looped transmission line section as are provided by the other embodiments.

Whereas this invention is here illustrated and described with respect to several embodiments thereof, it should be realized that various changes may be made without departing from the essential contributions to the art made by the teachings thereof.

I claim:

1. In a broad band amplifier including a multi-element amplifying device, signal input means to the device, voltage biasing means for said device and for the amplifier, with one of the elements of said multi-element amplifying device being a signal output element of the device and having predetermined impedance characteristics, and with the amplifier connected to a load having predetermined impedance characteristics; transmission line means connected between the signal output element of said device and the load, with said transmission line means having proper impedance transformation characteristics for correct impedance matching to said signal output element at the transmission line means connection with the signal output element and for correct impedance matching with the load at the transmission line means connection with the load; with said transmission line means including: a first transformer having relatively closely coupled primary and secondary coils in a first transmission line section with the transformer having an input connection from said signal output element of the multi-element amplifying device to the primary coil of the transformer and the output terminal of the primary coil being connected to the end terminal of the secondary coil of said transformer closest to the input terminal of the primary coil and through the secondary coil of the transformer to and through first capacitive means to ground; and with the output terminal of said primary coil being an output terminal of said first transmission line section.

2. The broad band amplifier of claim 1, wherein said multi-element amplifying device is a solid state device with said signal output element being an output electrode, with said voltage biasing means having a connection to said transmission line means, and said transmission line means providing D.C. biasing path means from said output electrode to said voltage biasing means.

3. The broad band amplifier of claim 2, wherein said solid state device is an NPN transistor.

4. The broad band amplifier of claim 1, wherein said transmission line means includes at least two transmission line sections, and wherein each transmission line section has a 4 to 1 impedance transformation, and with the total impedance transformation through the entire transmission line means being equal to $4^n$ with $n$ being the number of transmission line sections.

5. The broad band amplifier of claim 1, wherein the output terminal of said primary coil is connected through second capacitive means to a second transmission line section including: an input connection to a primary coil of a second transformer, and through the primary coil of said second transformer to an output terminal of said second transmission line section; and with said output terminal connected to the end terminal of a secondary coil of said second transformer closest to the input terminal of the primary coil of the second transformer and through a transformer coil to ground.

6. The broad band amplifier of claim 1, wherein a coil is included between the signal output element of the multi-element amplifying device and the first coil of the transformer.

7. In abroad band amplifier including a multi-element amplifying device, signal input means to the device, voltage biasing means for said device and for the amplifier, with one of the elements of said multi-element amplifying device being a signal output element of the device and having predetermined impedance characteristics, and with the amplifier connected to a load having predetermined impedance characteristics; transmission line means connected between the signal output element of said device and the load, with said transmission line means having proper impedance transformation characteristics for correct impedance matching to said signal output element at the transmission line means connection with the signal output element and for correct impedance matching with the load at the transmission line means connection with the load; with said transmission line means including: a first transformer in a first transmission line section with the transformer having an input connection from said signal output element of the multi-element amplifying device to a first coil of the transformer and the output terminal of the first coil being connected to the end terminal of a second coil of said transformer closest to the input terminal of the first coil and through the second coil of the transformer to and through first capactive means to ground; with the output terminal of said first coil being an output terminal of said first transmission line section; and wherein said first transmission line section includes: a second transformer, having a first coil and a second coil, with the output terminal of the first coil of the first transformer being connected through the first coil of the second transformer to the end terminal of the second coil of said first transformer closest to the input terminal of the first coil of the first transformer; and with the connection of the second coil of the first transformer to said first capacitive means including, a second output terminal and between the second output terminal and the said first capactive means the second coil of said second transformer.

8. The broad band amplifier of claim 7, wherein a voltage supply bias source is connected to the junction of the second coil of said second transformer with said first capactive means.

9. The broad band amplifier of claim 7, wherein the output terminal of said first coil of the first transformer is connected through second capacitive means to a second transmission line section including: an input connection to a first coil of a third transformer, and through the first coil of said third transformer to a first output terminal of said second transmission line section; and with said first output terminal connected to the end terminal of a second coil of said third transformer closest to the input terminal of the first coil of the third transformer and through a transformer coil to ground.

10. The broad band amplifier of claim 9, wherein said second transmission line section includes: a fourth transformer, having a first coil and a second coil, with the output terminal of the first coil of said third transformer being connected through a first coil of the fourth transformer to the end terminal of the second coil of said third transformer closest to the input terminal of the first coil of the third transformer and through the second coil of the third transformer to a second output terminal of the second transmission line section; and with the second output terminal of said first transmission line section being connected through, successively, third capacitive means and the second coil of said fourth transformer to the second output terminal of said second transmission line section.

(References on following page)

References Cited by the Examiner

UNITED STATES PATENTS

| | | | |
|---|---|---|---|
| 2,125,119 | 7/1938 | Lyman | 330—171 X |
| 2,284,529 | 5/1942 | Mason. | |
| 2,326,519 | 8/1943 | Burnside | 333—73 X |
| 2,463,229 | 3/1949 | Wheeler. | |
| 2,524,821 | 10/1950 | Montgomery | 330—158 X |
| 2,642,539 | 6/1953 | Lichtman | 330—53 X |
| 2,957,143 | 10/1960 | Enloe | 330—31 X |
| 2,961,578 | 11/1960 | Scharla-Nielson et al. | 330—192 X |

OTHER REFERENCES

Meagher et al.: Practical Analysis of Ultra High Frequency, RCA, August 1943, pages 1–24, page 8 relied on.

ROY LAKE, *Primary Examiner.*

F. D. PARIS, *Assistant Examiner.*